US012347797B2

(12) United States Patent
Sugioka et al.

(10) Patent No.: US 12,347,797 B2
(45) Date of Patent: Jul. 1, 2025

(54) APPARATUS, SEMICONDUCTOR DEVICE, AND REDISTRIBUTION LAYER STRUCTURE THEREOF

(71) Applicant: MICRON TECHNOLOGY, INC., Boise, ID (US)

(72) Inventors: Shigeru Sugioka, Hiroshima (JP); Keizo Kawakita, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 495 days.

(21) Appl. No.: 17/935,345

(22) Filed: Sep. 26, 2022

(65) Prior Publication Data

US 2024/0105648 A1 Mar. 28, 2024

(51) Int. Cl.
*H01L 23/00* (2006.01)
*H01L 23/522* (2006.01)
*H01L 25/18* (2023.01)

(52) U.S. Cl.
CPC .......... *H01L 24/02* (2013.01); *H01L 23/5226* (2013.01); *H01L 25/18* (2013.01); *H01L 2224/02311* (2013.01); *H01L 2224/0236* (2013.01); *H01L 2224/02381* (2013.01); *H01L 2224/0239* (2013.01)

(58) Field of Classification Search
CPC ..... H01L 24/02; H01L 23/5226; H01L 25/18; H01L 2224/02311; H01L 2224/0236; H01L 2224/02381; H01L 2224/0239; H01L 23/53295
See application file for complete search history.

(56) References Cited

U.S. PATENT DOCUMENTS

| | | | |
|---|---|---|---|
| 11,456,210 B2* | 9/2022 | Huang | H01L 21/76885 |
| 11,574,863 B2* | 2/2023 | Stamper | H01L 23/5329 |
| 11,605,558 B2* | 3/2023 | Chung | H01L 21/76832 |
| 2023/0268267 A1* | 8/2023 | Cheng | H01L 23/5252 257/774 |

* cited by examiner

*Primary Examiner* — Karen Kusumakar
(74) *Attorney, Agent, or Firm* — Dorsey & Whitney LLP

(57) ABSTRACT

According to one or more embodiments of the disclosure, an apparatus comprising a metal layer and a redistribution layer on the metal layer is provided. The redistribution layer includes an insulating layer, a via, and a redistribution metal layer. The via is in the insulating layer and has a rectangular shape in a plan view. The redistribution metal layer has a first thickness on a shorter side of the rectangular shape of the via and a second thickness on a longer side of the rectangular shape of the via. The second thickness is greater than the first thickness.

19 Claims, 6 Drawing Sheets

APPARATUS, SEMICONDUCTOR DEVICE, AND REDISTRIBUTION LAYER STRUCTURE THEREOF

BACKGROUND

A semiconductor device may include a plurality of metal layers on a semiconductor substrate. The semiconductor device may be provided with an air gap in a space between wirings of a top metal layer. The air gap reduces capacitance between the wirings in a lateral direction in the top metal layer and reduces power consumption of the semiconductor device.

A semiconductor device may include a redistribution layer or a redistribution layer structure on a metal layer on a semiconductor substrate. The redistribution layer includes an insulating layer and a via therein and improves an efficiency of wiring layout and a circuit array layout.

DETAILED DESCRIPTION

Figure 1:
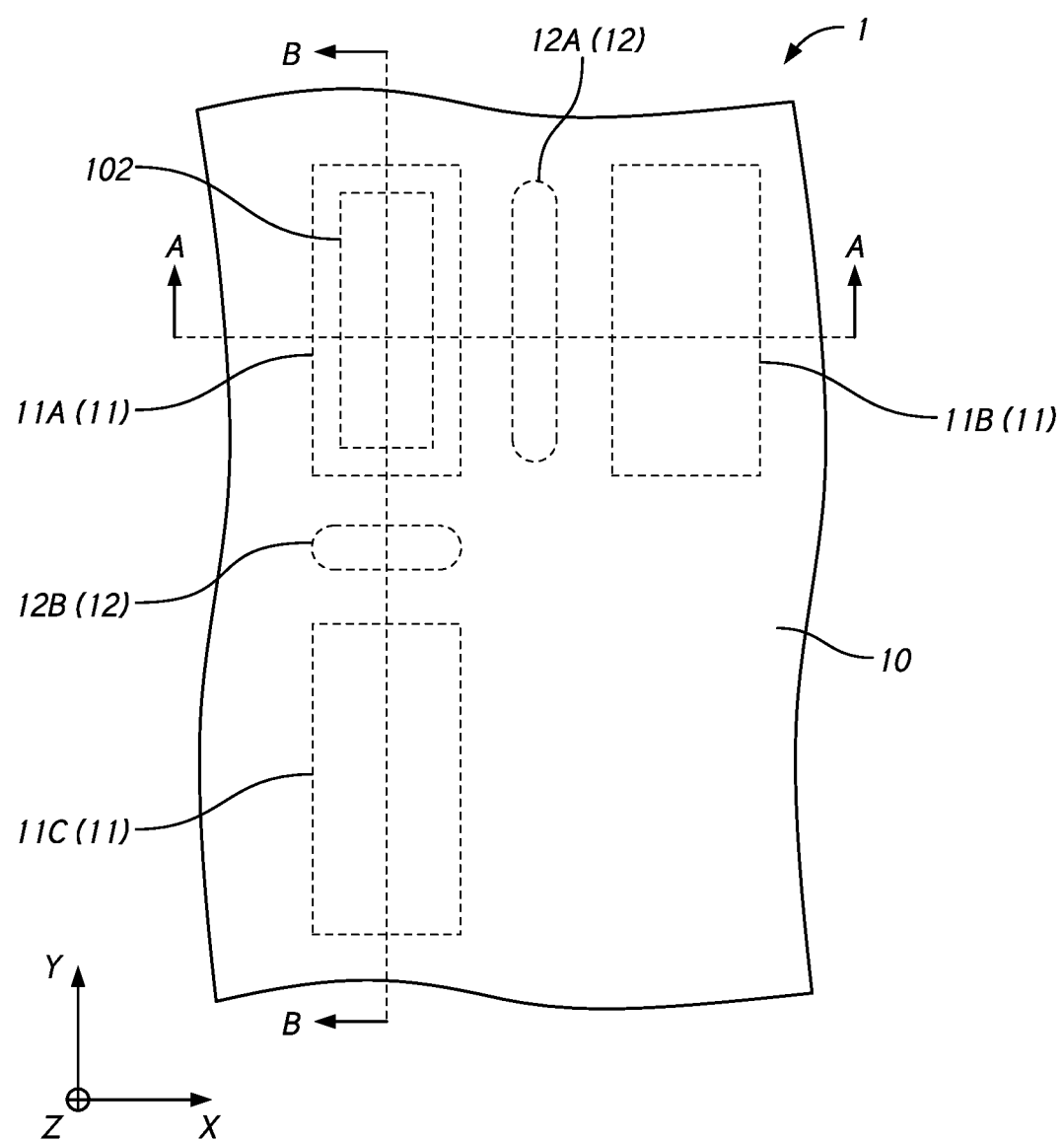
FIG. 1 depicts a schematic configuration of at least part of a semiconductor device in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, the dimensions and dimensional ratios of each unit do not necessarily match the actual dimensions and dimensional ratios in the embodiments.

FIG. 1 depicts an example of a schematic configuration of at least part of a semiconductor device 1 in a plan view according to an embodiment of the disclosure. FIGS. 2A and 2B and FIGS. 3A and 3B depict an example of a schematic configuration of at least part of the semiconductor device 1 in A-A and B-B cross-sections of FIG. 1 according to the present embodiment. FIG. 4 depicts an example of a schematic configuration of at least part of the semiconductor device 1 in a cross-sectional view according to the present embodiment. The semiconductor device 1 is one example of an apparatus according to the present embodiment.

In the example, the semiconductor device 1 may have a multi-layer wiring structure 14 on a semiconductor substrate 13 (see FIG. 4). The semiconductor device 1 may include a plurality of metal layers 141 stacked on top of each other. The plurality of metal layers 141 are electrically coupled by one or more conductive vias 142. The plurality of metal layers 141 and the vias 142 as well as other layers, elements and structures (not separately depicted) for the semiconductor device 1 may be formed on the semiconductor substrate 13 by any known techniques.

The semiconductor device 1 includes a metal layer 11. The metal layer 11 may be a top metal layer of the plurality of metal layers 141 in the multi-layer wiring structure 14 (see FIG. 4). The metal layer 11 includes a plurality of metal wirings 11A, 11B, and 11C. The metal wirings 11A, 11B, and 11C may also be referred to as top metal wirings in the case where the metal layer 11 is the top metal layer. The metal wirings 11A, 11B, and 11C include, for example, metal films. The metal wirings 11A, 11B, and 11C may include a metal material, such as aluminum (Al) or cupper (Cu). The metal wirings 11A and 11B are arranged next to each other in a first horizontal direction, which is X direction in the drawing. The metal wirings 11A and 11C are arranged next to each other in a second horizontal direction, which is Y direction in the drawing. X and Y directions are perpendicular to each other in a horizontal plane. Each of the metal wirings 11A, 11B, and 11C has a thickness in a third direction or a vertical direction, which is Z direction in the drawing. Z direction is perpendicular to X and Y directions in a vertical plane.

The semiconductor device 1 includes one or more air gaps 12 between the neighboring metal wirings 11A, 11B, and 11C. In the example, an air gap 12A is provided in a space between the neighboring metal wirings 11A and 11B in the horizontal (X) direction. An air gap 12B is provided in a space between the neighboring metal wirings 11A and 11C in the horizontal (Y) direction. Each air gap 12 extends in the vertical (Z) direction. The air gap 12A may have, in a plan view, an elongated shape in the Y direction between the metal wirings 11A and 11B. The air gap 12B may have, in a plan view, an elongated shape in X direction between the metal wirings 11A and 11C.

Figure 2A:
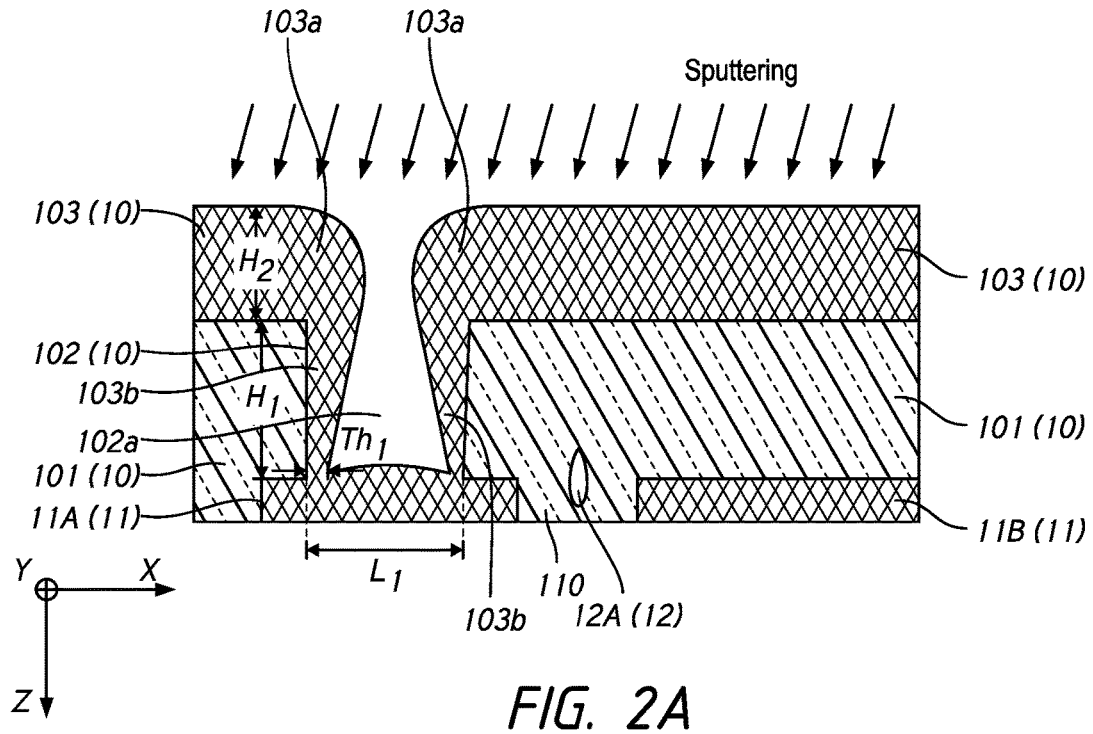
FIGS. 2A and 2B depict a schematic configuration of at least part of a semiconductor device in a cross-sectional view according to an embodiment of the disclosure.
Figure 2B:
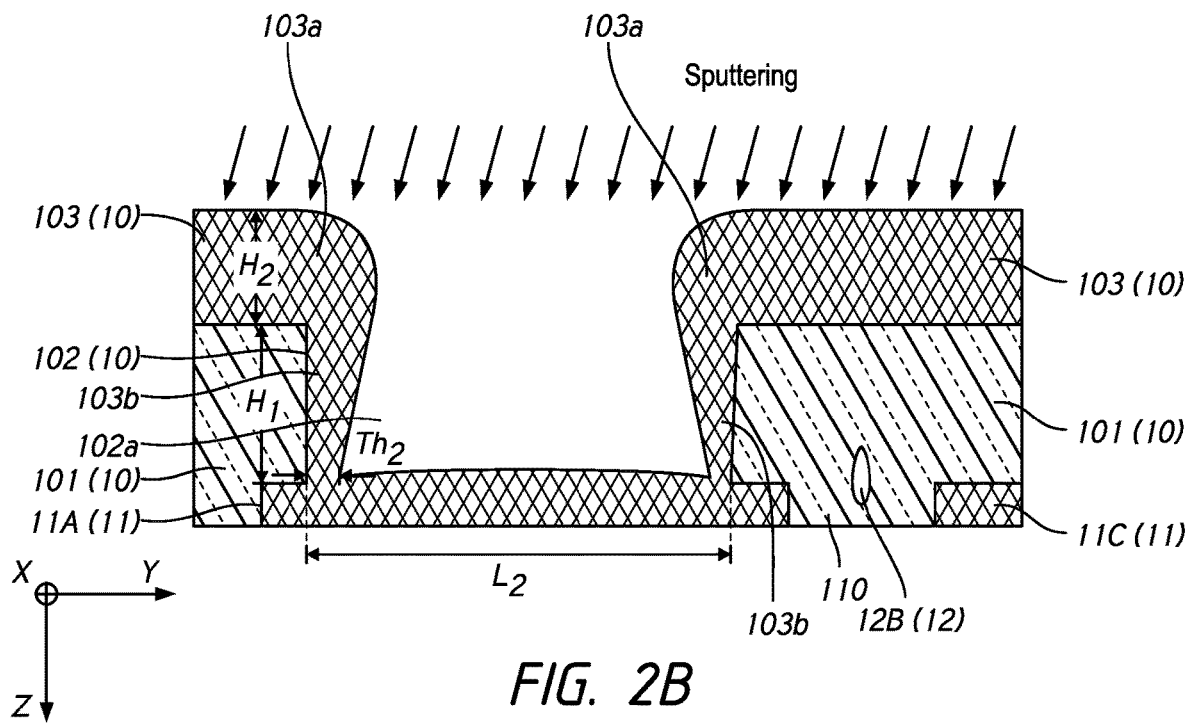

In the example, at least a top part of the air gap 12 is higher than an upper surface of each of the neighboring metal wirings 11A, 11B, and 11C in the vertical (Z) direction (see FIGS. 2A and 2B). The space 110 between the neighboring metal wirings 11A and 11B and 11C where the air gaps 12A and 12B are provided is filled with an insulating material. The provision of the air gaps 12A and 12B reduces capacitance between the metal wirings 11A, 11B, and 11C in the horizontal or lateral direction in the metal layer (or the top metal layer) 11 and reduces power consumption of the semiconductor device 1.

A height of the air gap 12 varies depending on a width or a length in the horizontal (X/Y) direction of the space 110 between the neighboring metal wirings 11A, 11B, and 11C, or vice versa. For example, if the width of the space 110 between the metal wirings 11A and 11B or between the metal wirings 11B and 11C is increased, the height of the air gap 12A or 12B may be increased. At the same time, to not make the air gap 12 too high, the space 110 between the metal wirings 11A and 11B or between the metal wirings 11B and 11C may be made narrower. Also, to not make the space 110 too narrow so as to avoid interference among the metal wirings 11A, 11B, and/or 11C, the width of the space 110 may be properly adjusted. The height of the air gap 12 and the width of the space 110 have a correlation to maximize the effect of reducing the device power consumption.

The semiconductor device 1 includes a redistribution layer or a redistribution layer structure 10 on the metal layer 11. The redistribution layer 10 may be provided to improve an array efficiency of the semiconductor device 1. In one instance, the semiconductor device 1 may include an array of main circuits, and one or more peripheral circuits next to or around the main circuit array, and increasing a size of the array of the main circuits or a number of the main circuits within a predetermined chip area increases the array efficiency. Such array efficiency may be improved through achievement of a further efficient layout of wirings and a further flexible position of electrode pads by forming the redistribution layer 10. The redistribution layer 10 may be formed during wiring forming processing, such as a back end of line (BEOL).

In the example, the redistribution layer (or the redistribution layer structure) 10 includes an insulating layer 101, a via 102, and a redistribution metal layer 103.

The insulating layer 101 is provided on the metal layer 11. The insulating layer 101 may be a dielectric layer. The insulating layer 101 may include an insulating material, such as oxide. In the example, the insulating layer 101 covers the metal layer 11 where there is no via 102, while the insulating layer 101 partially covers the metal layer 11 where the via 102 is provided. The insulating layer 101 may be deposited on the metal layer 11 by chemical vapor deposition (CVD).

The via 102 is provided in the insulating layer 101. The via 102 extends or penetrates through the insulating layer 101 in the vertical (Z) direction and reaches the metal layer 11. In the example, the via 102 is provided at a position corresponding to the metal wiring 11A of the metal layer 11 and reaches an upper surface of the metal wiring 11A.

The via 102 according to the present embodiment has a rectangular shape in a plan view or when viewed from above as illustrated in FIG. 1. The via 102 of the rectangular shape provides an open area or a via opening 102a shorter in the first horizontal direction or X direction and longer in the second horizontal direction or Y direction over the metal wiring 11A in a plan view. The via 102 has a shorter side in the first (X) direction and a longer side in the second (Y) direction. The via 102 of the rectangular shape may be formed by, for example, photolithography using a photomask or a reticle having the corresponding rectangular shape, followed by etching and other appropriate known processes.

The redistribution metal layer 103 is provided on the insulating layer 101 including the via 102. The redistribution metal layer 103 is provided at least on an inner side wall of the via 102 and the upper surface of the insulating layer 101 around the via 102. Part of the redistribution metal layer 103 is also provide on a bottom surface of the via 102.

The redistribution metal layer 103 includes a metal material, such as Al. The redistribution metal layer 103 may further includes a lower barrier metal, such as titanium Ti, and an upper barrier metal, such as titanium nitride TiN. The redistribution metal layer 103 may be formed by sputter or sputtering. Sputtering may also be referred to as physical vapor deposition (PVD). During the sputtering, the metal material of the redistribution metal layer 103 is applied or deposited to the upper surface of the insulating layer 101 and the opening 102a of the via 102 from an angled direction as illustrated in FIGS. 2A and 2B. Because of the sputtering in the angled direction as well as height or vertical-position differences among sputtering target surfaces of the insulating layer 101 and the via 102, the metal material tends to accumulate more on the upper surface of the insulating layer 101 and accumulate gradually less toward a bottom part or a lower part of the opening 102a of the via 102. The redistribution metal layer 103 in the example hence has a thickness in the horizontal (X/Y) direction gradually decreasing toward the bottom or lower part of the opening 102a or, in other words, gradually increasing toward an upper part of the opening 102a. And, the redistribution metal layer 103 has an overhung portion (may simply be referred to as an overhang) 103a over the opening 102a of the via 102. The sputtering is performed in such a manner that the overhung portion 103a does not close the opening 102a. Through the opening 102a, further layers, such as a passivation layer 15 and a polyimide layer 16 (see FIGS. 3A and 3B), are formed in the via 102.

During the sputtering, a side portion 103b of the redistribution metal layer 103 is formed on the inner sidewall of the via 102. This side portion 103b has a first thickness (or a first cross-sectional thickness) $Th_1$ on the shorter side of the rectangular shape of the via 102 in the first (X) direction and a second thickness (or a second cross-sectional thickness) $Th_2$ on the longer side of the rectangular shape of the via 102 in the second (Y) direction. According to the present embodiment, the second thickness $Th_2$ is greater than the first thickness $Th_1$. That is, $Th_2 > Th_1$.

Because of the rectangular shape of the via 102 and hence the rectangular shape of the opening 102a, the metal material entering into the opening 102a from the angled direction tends to accumulate less on the inner sidewall of the via 102 in the shorter side of the rectangular shape (FIG. 2A) and accumulate more on the inner sidewall of the via 102 in the longer side of the rectangular shape (FIG. 2B). This achieves $Th_2 > Th_1$.

In the example, the lowermost part of the side portion 103b on the shorter side of the via 102 has the smallest thickness $Th_1$ in X-direction, and the lowermost part of the side portion 103b of the redistribution metal layer 103 on the longer side of the via 102 has the smallest thickness $Th_2$ in Y-direction. And, $Th_2$ is greater than $Th_1$. This thickness relationship may exist between other parts of the side portion 103b of the redistribution metal layer 103. In one instance, the smallest thicknesses $Th_1$ and $Th_2$ of the side portion 103b may be found at a position slightly above the lowermost part (but within a relatively lower part or portion) of the side portion 103b, and still $Th_2$ is greater than $Th_1$. Furthermore, in the example, an upper part or portion of the side portion 103b has a third thickness (or a third cross-sectional thickness) on the shorter side of the rectangular shape of the via 102 greater than at least the first thickness $Th_1$ or greater than both the first and second thicknesses $Th_1$ and $Th_2$.

The relationship of $Th_2 > Th_1$ can suppress or mitigate variations in contact resistance of the via 102. Hence, for example, when compared with a via of a square shape in a plan view which has the same side length as a shorter-side length of the rectangular shape of the via 102, it is possible to increase a height (or a depth) $H_1$ of the via 102 more than the square-shape via while maintaining the same or substantially the same value of the contact resistance and/or the same or substantially the same variations in contact resistance as the square-shape via. This leads to an increased height of the insulating layer 101 where the via 102 is provided, and the air gaps 12A and 12B formed between the neighboring metal wirings 11A and 11B and between the neighboring metal wirings 11A and 11C in the metal layer 11 underneath the redistribution layer 10 do not expose on the upper surface of the insulating layer 101 so that a slurry or resist during chemical mechanical polishing (CMP) processing of the insulating layer 101 does not enter the air gaps 12A and 12B. Consequently, the width of the space 110 between the metal wirings 11A and 11B or between the neighboring metal wirings 11A and 11C does not need to be further narrowed, thereby avoiding possible wiring interference in the lateral direction in the metal layer 11 while maintaining the flexibility of the wiring layout of the metal layer 11.

In the example, the via 102 has the height $H_1$ in the vertical (Z) direction, a shorter-side length $L_1$ in one horizontal (X) direction, and a longer-side length $L_2$ in another horizontal (Y) direction. These lengths are of the rectangular shape in a plan view and provides the opening 102a of the same plan-view rectangular shape over the metal layer 11. The aspect ratio estimated on the shorter side of the rectangular shape of the via 102 is the aspect ratio between the height $H_1$ of the via 102 and the shorter-side length $L_1$ of the via 102, that is $H_1/L_1$. This $H_1/L_1$ may be equal to or greater than 1.0. Another aspect ratio is between the height $H_1$ of the via 102 and the longer-side length $L_2$ of the via 102, that is $H_1/L_2$.

Some example cases of the sizes and the aspect ratios of the via 102 are as follows ("um" indicating micrometer or $10^{-6}$ meter):

Case 1. $H_1$=2.0 um, $L_1$=2.0 um, $L_2$=4.0 um, $H_1/L_1$=2.0/2.0=1.00, $H_1/L_2$=2.0/4.0=0.50;

Case 2. $H_1$=3.0 um, $L_1$=2.0 um, $L_2$=6.0 um, $H_1/L_1$=3.0/2.0=1.50, $H_1/L_2$=3.0/6.0=0.50; and Case 3. $H_1$=3.4 um, $L_1$=3.0 um, $L_2$=6.0 um, $H_1/L_1$ is 3.4/3.0=1.13, $H_1/L_2$ is 3.4/6.0=0.57.

As shown in the example cases, the via 102 in the redistribution layer structure 10 according to the present embodiment has the aspect ratio $H_1/L_1$ equal to or greater than 1.0.

Also, regarding the space 110 between the neighboring metal wirings 11A and 11B or 11A and 11C, the width of the space 110 can be increased by increasing the longer-side length $L_2$ of the via 102 while maintaining the aspect ratio $H_1/L_2$. For example, in Case 1 and Case 2 where $L_2$=4.0 um and 6.0 um while $H_1/L_2$=0.50, the width of the space 110 can be 1.4 um and 2.2 um, respectively. That is, Case 2 achieves the wider wiring space than Case 1 and at the same time the higher air gap than Case 1. Case 2 hence achieves more reduction of lateral capacitance and device power consumption and less wiring interference than Case 1, while also maintaining the wiring layer flexibility.

In the example, the redistribution metal layer 103 of the redistribution layer 10 has a height $H_2$ on the upper surface of the insulating layer 101. This height $H_2$ may be 2.2 um, for example. The respective sizes of the via 102 and the redistribution metal layer 103 in the redistribution layer 10 are not limited to the examples described herein.

Figure 3A:
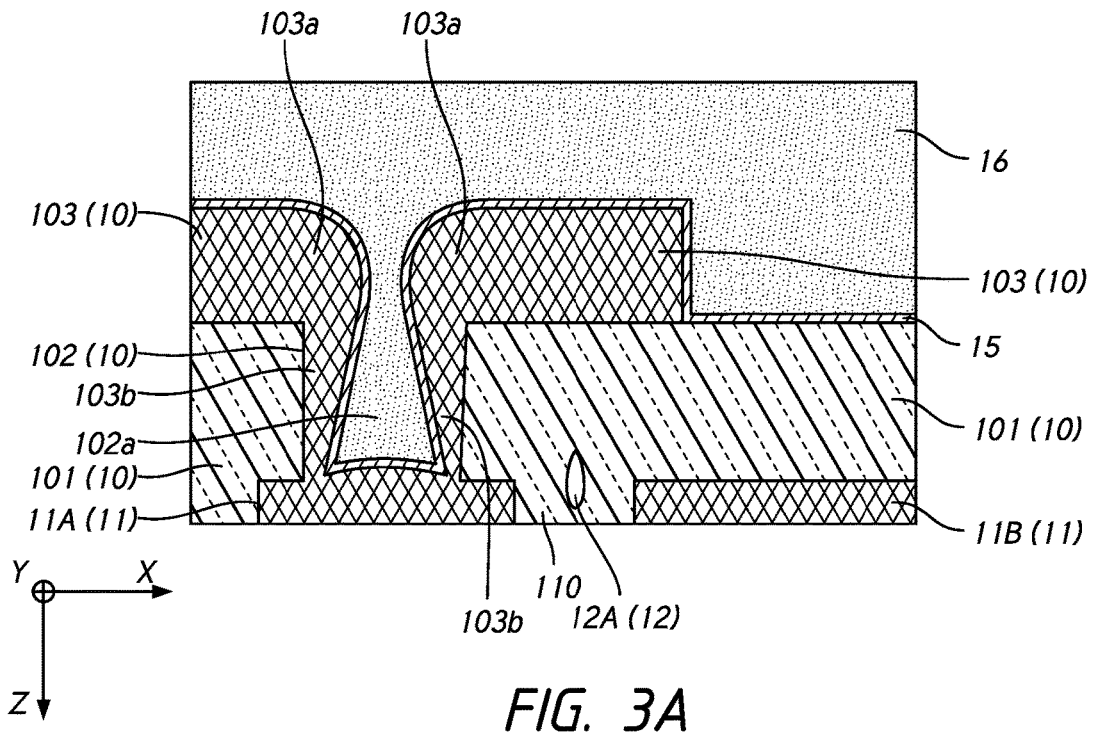
FIGS. 3A and 3B depict a schematic configuration of at least part of a semiconductor device in a cross-sectional view according to an embodiment of the disclosure.
Figure 3B:
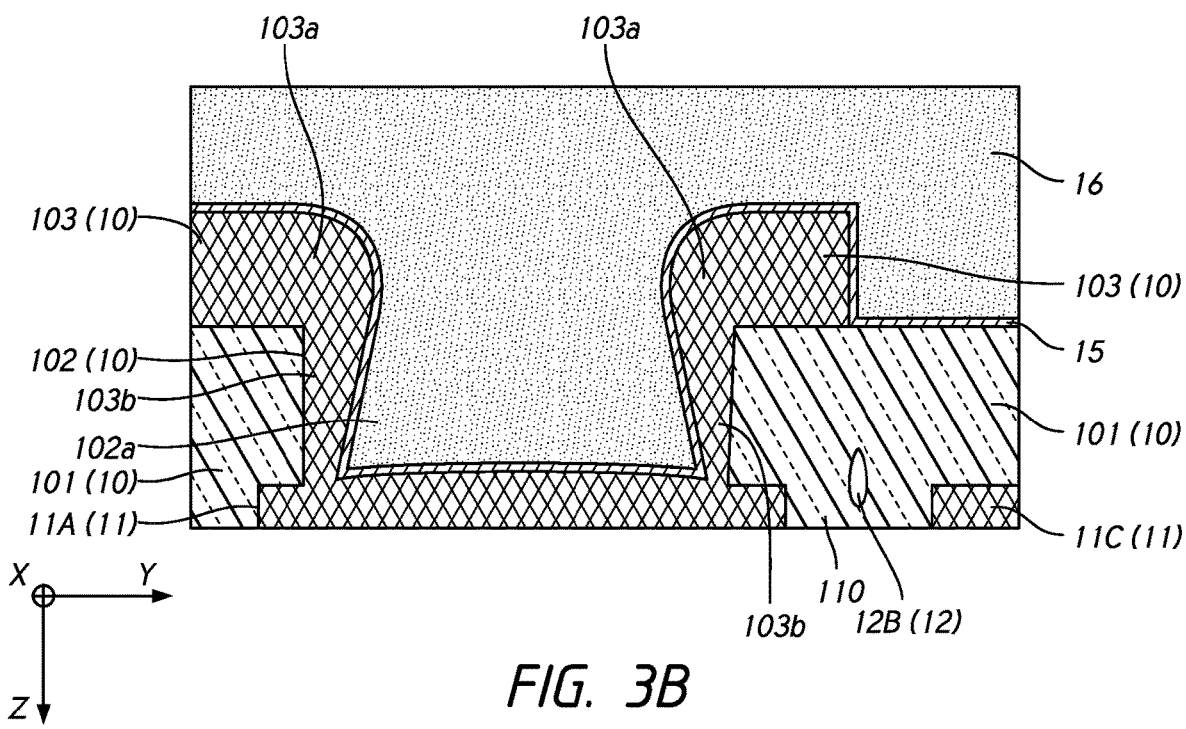
Figure 4:
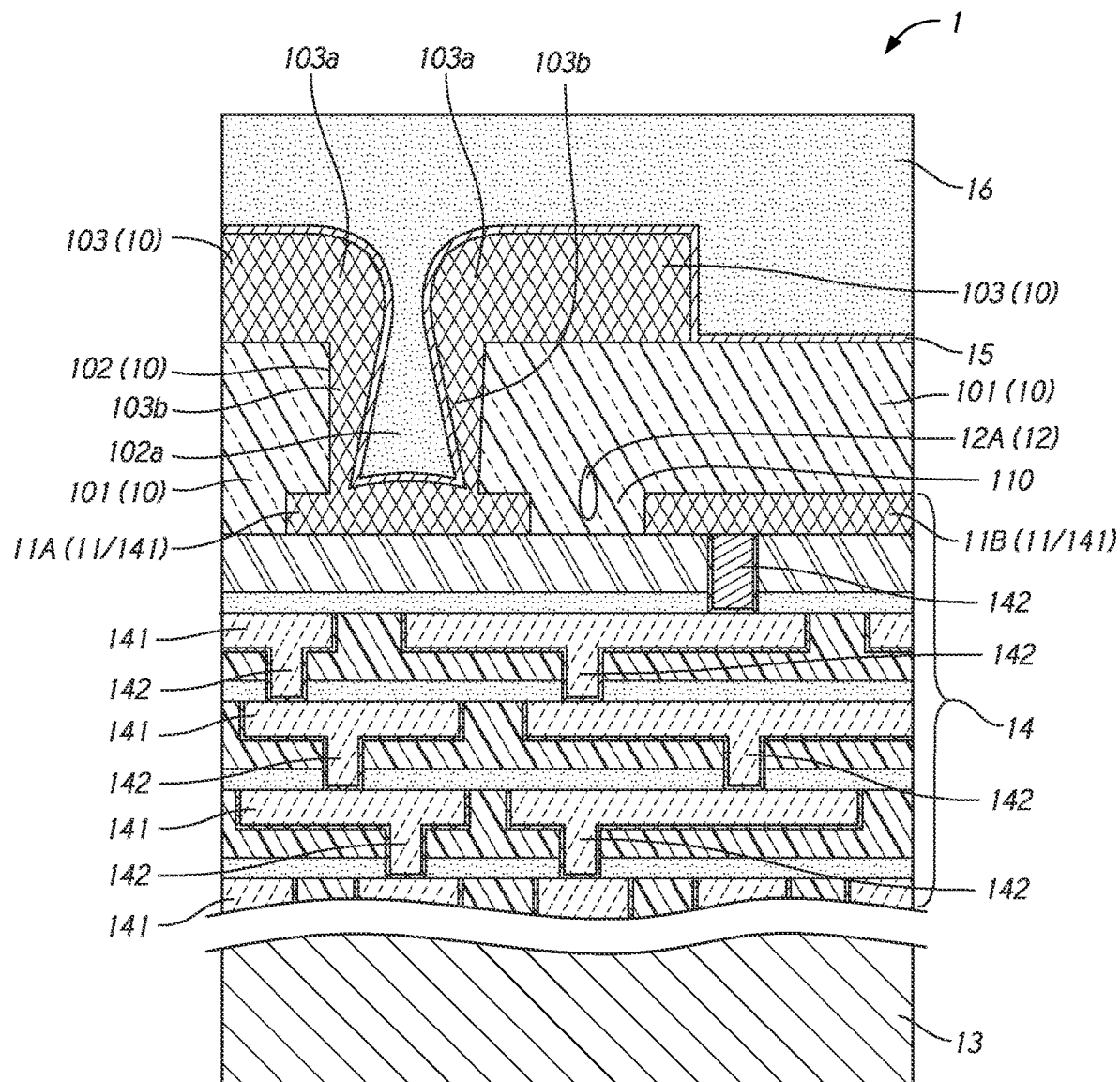
FIG. 4 depicts a schematic configuration of at least part of a semiconductor device in a cross-sectional view according to an embodiment of the disclosure.

As shown in FIGS. 3A and 3B and FIG. 4, the semiconductor device 1 further includes a passivation layer 15 as a surface protection layer on exposed surfaces of the insulating layer 101 and the redistribution metal layer 103 of the redistribution layer 10. The passivation layer 15 may include a passivation film. The passivation layer 15 may include, for example, nitride (N) or silicon nitride (SiN). Additionally, on the passive layer 15, there is provided a polyimide layer 16, where subsequent processing such as, a photolithography process and an etching process (either dry or wet as appropriate), is performed to provide an electrode pad structure.

Figure 5:
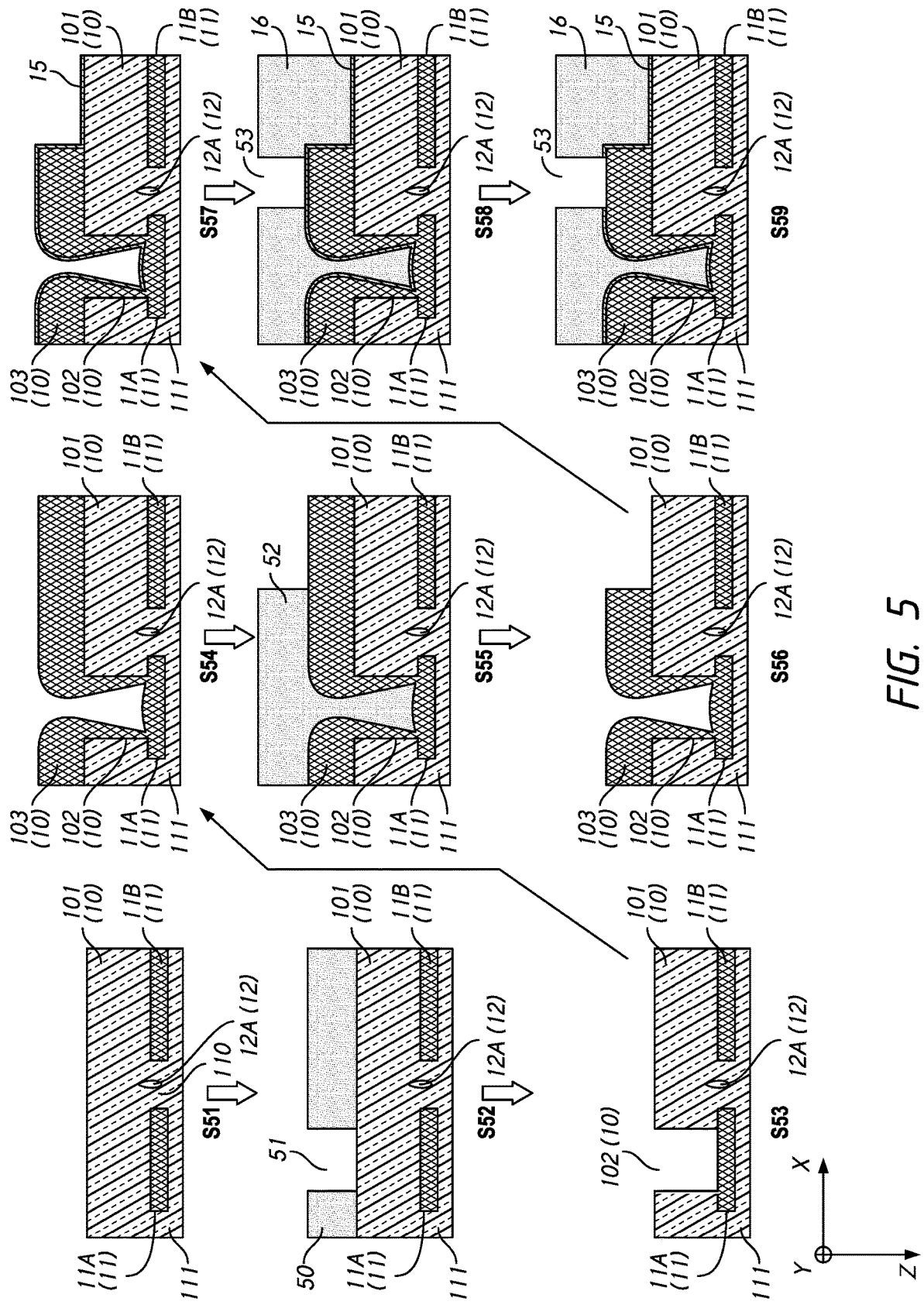
FIG. 5 depicts an example of a method of forming at least part of a semiconductor device 1 in a cross-sectional view according to an embodiment of the disclosure.

FIG. 5 depicts an example of a method of forming at least part of the semiconductor device 1 including the metal layer 11 and the redistribution layer 10 in the cross-sectional view according to an embodiment of the disclosure. This example illustrates formation processes of the structure (or at least part thereof) including the metal wirings 11A and 11B and the air gap 12A shown in FIGS. 2A and 3A. Similar processes are applicable to formation of the structure (or at least part thereof) including the metal wirings 11A and 11C and the air gap 12B shown in FIGS. 2B and 3B.

Prior to forming the metal layer 11 and the redistribution layer 10, in the case of the semiconductor device 1 of the multi-layer wiring structure 14 shown in FIG. 4, the plurality of metal layers 141, the vias 142 and other layers and structures are provided on the semiconductor substrate 13 (see FIG. 4) by conventional methods. The metal layer 11 may be a separate layer from the multi-layer wiring structure 14 or may constitute the top metal layer of the multi-layer wiring structure 14. In either case, the metal wirings 11A and 11B (and the metal wiring 11C, not separately depicted) are patterned in the metal layer 11 by conventional methods and conditions, except that the width of the space 110 between the metal wirings 11A and 11B (and 11C) can be determined as described above according to the present embodiment.

After patterning the metal layer 11 by, for example, photo and etching techniques (which may be any conventional photo and etching techniques as appropriate), the insulating layer 101 of the redistribution layer 10 is deposited on the metal layer 11 by, for example, CVD, and polished by, for example, chemical mechanical polishing (CMP) (S51). There is an underlying insulating layer 111 on which the metal layer 11 is provided. The underlying insulating layer 111 includes an insulating material, such as oxide. The insulating layer 101 includes the same insulating material as the underlying insulating layer 111, thereby surrounding the entirety or substantially the entirety of the metal layer 11. During CVD of the insulating layer 101, the air gap 12A is also formed between the metal wirings 11 A and 11B (and the air gap 12B between the metal wirings 11A and 11C, not separately depicted). The formation of the air gap 12 in the metal layer 11 can be performed under conventional CVD conditions as appropriate except that the height of the air gap 12 can be determined as described above according to the present embodiment. As depicted, for example, the top part of the air gap 12A is higher than the upper surface of each of the neighboring metal wirings 11A and 11B in the vertical (Z) direction. Also, the air gap 12A is not exposed on the upper surface of the insulating layer 101 of the redistribution layer 10. The same goes for the air gap 12B. This prevents slurry or resist from entering into the air gap 12 during later processes and realizes the air gap 12 with the expected effects.

Next, a resist layer 50 is coated on the upper surface of the insulating layer 101, and photolithography and etching (either dry or wet) are applied to form the via 102 of the redistribution layer 10 in the insulating layer 101 (S52 and S53). The formation of the via 102 can be done by any conventional photo and etching techniques and conditions as appropriate, except that the via 102 according to the present embodiment is formed with the rectangular shape in a plan view (see FIG. 1) by using, for example, a photomask or a reticle having a corresponding plan-view rectangular-shaped pattern so that a corresponding rectangular-shaped area 51 in the resist layer 50 is photo-exposed, followed by development, etching, and other appropriate processes.

Subsequently, the redistribution metal layer 103 of the redistribution layer 10 is formed on the surfaces of the via 102 and the insulating layer 101 by sputtering or PVD (S54). During the sputtering, the metal material, such as Al, accumulates on the upper surface of the insulating layer 101 and at the same time enters into the opening of the via 102 and accumulates on the inner sidewall and the bottom of the via 102. Due to the sputtering in the angled direction and the rectangular shape of the via 102, the thickness of the redistribution metal layer 103 varies as described above with reference to the previous figures. During this sputtering process, a lower barrier metal, such as titanium Ti, and an upper barrier metal, such as titanium nitride TiN, may also be deposited to form a Ti/Al/TiN film in the redistribution metal layer 103.

Another resist layer 52 is then coated on the surface of the redistribution metal layer 103, and certain areas (in the example, areas next to the via 102) of the redistribution metal layer 103 is removed by conventional photo and etching processes to pattern redistribution wirings in the redistribution metal layer 103 (S55 and S56).

A passivation layer 15 and a polyimide layer 16 are then formed by a CVD (for example, plasma CVD) process and photo and etching processes to provide a pad structure 53 over the redistribution layer structure 10 (S57, S58, and S59).

Figure 6:
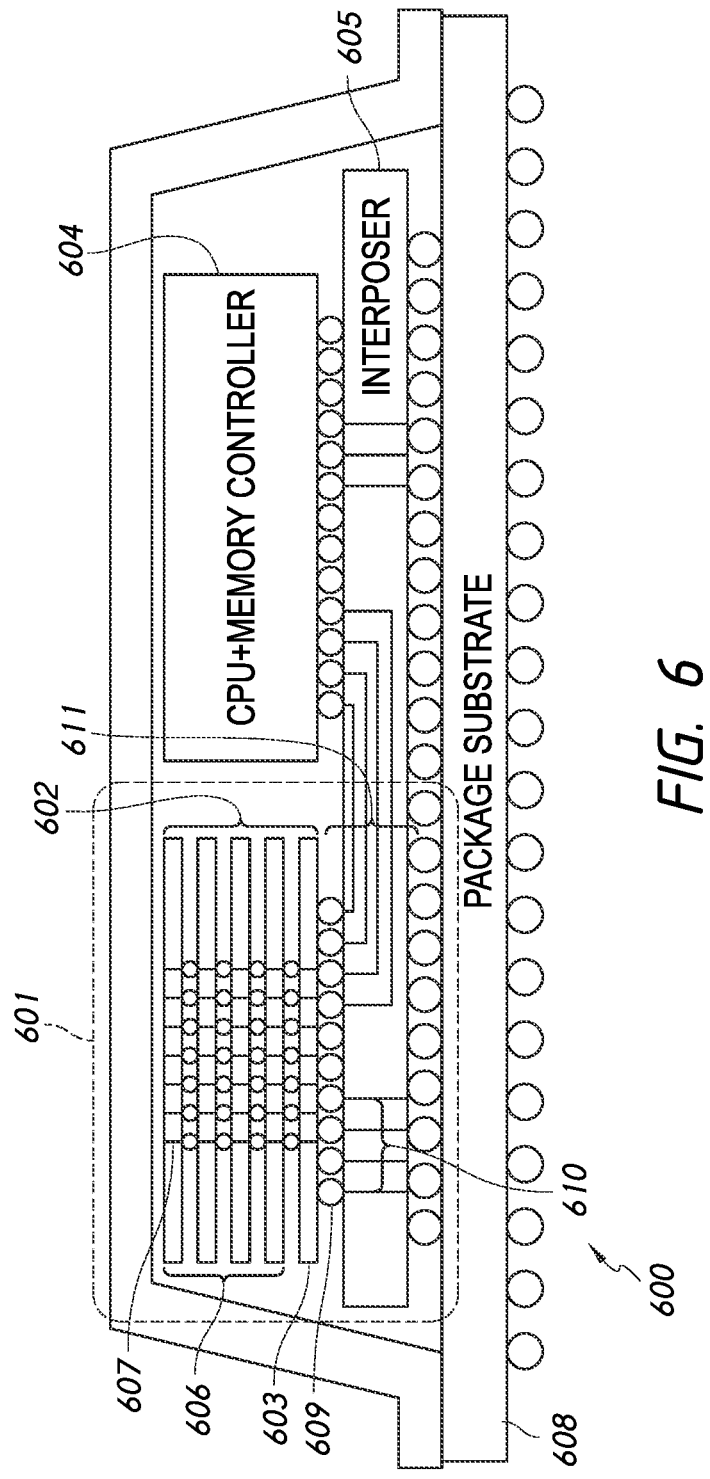
FIG. 6 depicts a schematic configuration of a semiconductor system according to an embodiment of the disclosure.

FIG. 6 depicts an example of a schematic configuration of a semiconductor system according to an embodiment of the disclosure. The semiconductor system 600 includes an apparatus, which is a semiconductor memory device 601 in an embodiment of the disclosure. The semiconductor memory device 601 may be one example of the semiconductor device 1. The semiconductor system 600 may also include a central processing unit (CPU) and memory controller 604, which may be a controller chip, on an interposer 605 on a package substrate 608. The interposer 605 may include one or more power lines 610 which may supply power supply voltage from the package substrate 608. The interposer 605 may include a plurality of channels 611 that may interconnect the CPU and memory controller 604 and the semiconductor memory device 601. For example, the semiconductor memory device 601 may be a dynamic random access memory (DRAM). The memory controller 604 may provide a clock signal, a command signal, and may further transmit and receive data signals. The plurality of channels 611 may transmit the data signals between the memory controller and the semiconductor memory device 601. The semiconductor memory device 601 may include a plurality of chips 602 including an interface (I/F) chip 603 and a plurality of memory core chips 606 stacked with each other. A number of the memory core chips 606 may not be limited to 4 and may be more or fewer as appropriate. Each of the memory core chips 606 may include a plurality of memory cells and circuitries accessing the memory cells. For example, the memory cells may be dynamic random access memory (DRAM) memory cells. The semiconductor memory device 601 may include conductive vias 607 which couple the OF chip 603 and the memory core chips 606 by penetrating the OF chip 603 and the memory core chips 606. The OF chip 603 may be coupled to the interposer 605 via interconnects 609. For example, the interconnects 609 may be microbumps having bump pitches of less than about or less than one hundred micrometers and exposed on an outside of the OF chip 603. A portion of each of the interconnects 609 may be coupled to the one or more power lines 610. Another portion of each of the interconnects 609 may be coupled to one or more of the channels 611.

DRAM is merely one example of the semiconductor memory device 601 or the semiconductor device 1, and the embodiments and the above descriptions thereof are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, can also be applied as the semiconductor memory device 601 or the semiconductor device 1. Furthermore, devices other than memory, including logic ICs, such as a microprocessor and an application-specific integrated circuit (ASIC), are also applicable as the semiconductor device according to the present embodiments.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:
   a metal layer; and
   a redistribution layer on the metal layer, the redistribution layer comprising:
   an insulating layer;
   a via in the insulating layer, the via having a rectangular shape in a plan view; and
   a redistribution metal layer having a first thickness on a shorter side of the rectangular shape of the via and a second thickness on a longer side of the rectangular shape of the via, the second thickness greater than the first thickness.

2. The apparatus according to claim 1, wherein
   the first thickness and the second thickness are on the shorter side and the longer side of the rectangular shape in a lower portion of the via, respectively, and
   the redistribution metal layer further has a third thickness on the shorter side of the rectangular shape in an upper portion of the via, the third thickness greater than the first thickness.

3. The apparatus according to claim 1, wherein an aspect ratio between a height of the via and a shorter-side length of the via is equal to or greater than 1.0.

4. The apparatus according to claim 1, wherein
   the metal layer includes a plurality of metal wirings,
   the apparatus further comprises an air gap between neighboring metal wirings among the plurality of metal wirings, and
   a top part of the air gap is higher than an upper surface of each of the neighboring metal wirings.

5. The apparatus according to claim 4, wherein the air gap is not exposed on an upper surface of the insulating layer of the redistribution layer.

6. The apparatus according to claim 1, where the metal layer is a top metal layer of a plurality of metal layers.

7. The apparatus according to claim 1, wherein the apparatus is a memory device.

8. A semiconductor device, comprising:
a metal layer on a semiconductor substrate; and
a redistribution layer on the metal layer, the redistribution layer comprising:
an insulating layer;
a via in the insulating layer, the via extending through the insulating layer and reaching the metal layer; and
a redistribution metal layer at least on an inner sidewall of the via and an upper surface of the insulating layer, wherein
the via has a rectangular shape in a plan view, providing a via opening shorter in a first horizontal direction and longer in a second horizontal direction over the metal layer, and
the redistribution metal layer on the inner sidewall of the via has a first thickness on a shorter side of the rectangular shape of the via and a second thickness on a longer side of the rectangular shape of the via, the second thickness greater than the first thickness.

9. The semiconductor device according to claim 8, wherein an aspect ratio between a height of the via and a shorter-side length of the via is equal to or greater than 1.0.

10. The semiconductor device according to claim 8, wherein
the first thickness and the second thickness are on the shorter side and the longer side of the rectangular shape in a lower portion of the via, respectively, and
the redistribution metal layer further has a third thickness on the shorter side of the rectangular shape in an upper portion of the via, the third thickness greater than the first thickness.

11. The semiconductor device according to claim 8, wherein the redistribution metal layer includes aluminum.

12. The semiconductor device according to claim 8, wherein
the metal layer includes a plurality of metal wirings, and
the semiconductor device further comprises an air gap between neighboring metal wirings among the plurality of metal wirings.

13. The semiconductor device according to claim 12, wherein a top part of the air gap is higher than an upper surface of each of the neighboring metal wirings.

14. The semiconductor device according to claim 12, wherein the air gap is not exposed on an upper surface of the insulating layer of the redistribution layer.

15. The semiconductor device according to claim 8, where the metal layer is a top metal layer of a plurality of metal layers on the semiconductor substrate.

16. A redistribution layer structure, comprising:
an insulating layer;
a via in the insulating layer, the via extending through the insulating layer in a vertical direction; and
a redistribution metal layer on an inner sidewall of the via and an upper surface of the insulating layer, wherein
the via has a rectangular shape in a plan view, providing a via opening shorter in a first horizontal direction and longer in a second horizontal direction,
the redistribution metal layer includes a side portion on the inner sidewall of the via, and
the side portion of the redistribution metal layer has a first thickness on a shorter side of the rectangular shape of the via and a second thickness on a longer side of the rectangular shape of the via, the second thickness greater than the first thickness.

17. The redistribution layer structure according to claim 16, wherein
the first thickness and the second thickness are on the shorter side and the longer side of the rectangular shape in a lower portion of the via, respectively, and
the side portion of the redistribution metal layer further has a third thickness on the shorter side of the rectangular shape in an upper portion of the via, the third thickness greater than the first thickness.

18. The redistribution layer structure according to claim 16, wherein an aspect ratio between a height of the via and a shorter-side length of the via is equal to or greater than 1.0.

19. The redistribution layer structure according to claim 16, wherein
the insulating layer is on a metal layer, and
the metal layer is on a semiconductor substrate.

* * * * *